United States Patent [19]

Charransol et al.

[11] 3,989,894
[45] Nov. 2, 1976

[54] SYNCHRONISM ERROR DETECTING AND CORRECTING SYSTEM FOR A CIRCULATING MEMORY

[75] Inventors: Pierre Charransol, Paris; Jacques Sallé, Vanves; Jacques Becker, Paris, all of France

[73] Assignee: International Standard Electric Corporation, New York, N.Y.

[22] Filed: Dec. 13, 1973

[21] Appl. No.: 424,298

[30] Foreign Application Priority Data
Dec. 21, 1972 France .............................. 72.45697

[52] U.S. Cl. .................... 178/69.5 R; 235/153 AM; 340/146.1 D; 340/172.5
[51] Int. Cl.² ........................................... H04L 7/00
[58] Field of Search ........ 178/69.5 R; 235/153 AM; 340/146.1 D, 172.5; 179/15 BS

[56] References Cited
UNITED STATES PATENTS

| | | |
|---|---|---|
| 3,368,203 | 2/1968 | Loizides ........................... 340/172.5 |
| 3,473,150 | 10/1969 | McClelland .................. 340/146.1 D |
| 3,560,924 | 2/1971 | McBride ...................... 340/146.1 D |
| 3,562,710 | 2/1971 | Halleck ....................... 340/146.1 D |
| 3,732,547 | 5/1973 | Etra ................................ 340/172.5 |
| 3,733,585 | 5/1973 | Merlo .......................... 340/146.1 D |

Primary Examiner—Malcolm A. Morrison
Assistant Examiner—Errol A. Krass
Attorney, Agent, or Firm—J. B. Raden; M. M. Chaben

[57] ABSTRACT

A system is disclosed for checking and correcting the synchronism of bits stored in a circulating memory which is part of a PCM switching system. Periodically, bits previously written in an addressable memory are read-out and compared to corresponding bits supplied by the circulating memory. In accordance with results of the comparison, a synchronism signal or a fast or slow correction signal is supplied.

3 Claims, 8 Drawing Figures

SYNCHRONISM ERROR DETECTING AND CORRECTING SYSTEM FOR A CIRCULATING MEMORY

BACKGROUND OF THE INVENTION

1. Field of the Invention

The present invention concerns a synchronism error detection and correction system for a circulating memory. It may be used, in particular, in a telephone exchange employing time division switching for pulse code modulation signals.

2. Description of the Prior Art

At the inputs of such an exchange, the signals from the lines are sampled at 8 kHz and each sample is converted into a 8-bit coded combination. Each 8-bit combination is transmitted in parallel on eight conductors in a very short time interval constituting a time channel. It is thus possible to time multiplex 256 channels, for example. The recurring period of the successive time slots of a same channel is 125 $\mu$s, whereas the duration of each time slot is approximately 500 ns. An incoming multiplex group thus routes the signals from 256 lines. A similar outgoing multiplex group thus routes the signals towards the same 256 lines. The above-mentioned numerical values, without being necessary, are nevertheless currently admitted.

Inside the exchange, it is necessary that a coded signal combination appearing in a channel time slot of a multiplex group be retransmitted in any channel time slot of any multiplex group. This entails space switching operations (connections from group to group) and time switching operations (connections from channel to channel). They will be carried out by means of a network including space switches and stores. This network may be, for example, of the well-known space-time-space type. A connection path between an incoming channel of a first line and an outgoing channel of a second line uses two space switches, arranged, in a way, on each side of a memory cell; they give it access respectively to the incoming multiplex groups and to the outgoing multiplex groups. In this way, at the time slot assigned to the incoming channel and through the first switch oriented onto the appropriate incoming group, a coded combination originated from the incoming channel is stored in the memory cell. At the time assigned to the outgoing channel and through the second switch oriented onto the appropriate outgoing group, the coded combination originated from the incoming channel and stored in the memory cell is retransmitted on the outgoing channel. The connection in the opposite direction between the outgoing channel of the first line and the incoming channel of the second line, is carried out in the same way and uses generally the same memory cell.

In practice, the necessary numerous memory cells are memory cells belonging to several speech stores and two space switches are associated with each store, an incoming group switch and an outgoing group switch. In a speech store, at each time slot, a memory cell is addressed in order to be the object first of a read operation and then of a write operation, according to the just described switching system. At the same time, the incoming group switch and the outgoing group switch must receive a group address in order to take the appropriate orientation.

Thus, there has been provided a path store associated with each speech store and its relevant switches, which will supply, at each time slot, the necessary addresses, that is an address for the speech store and an address for the switches. This path store has 256 cells, one per time slot, which are cyclically read-out in synchronism with the multiplex group time slots.

As in the total cost of such an exchange, the stores are a substantial part of it, the most economical stores are being used, as far as it is possible. At present, the most economical stores are the circulating memories of the MOS type. The basic element of these memories is a shift register which may have 256 stages and thus memorize 256 bits, one per time slot in the concerned application. By juxtaposing $n$ of these registers, a circulating memory is obtained which can memorize 256 words of $n$ bits and be used as a path store. Normally, the output of this circulating memory is connected to its input and the 256 words it contains cyclically circulate in response to pulses corresponding to each time slot; these words are one by one available, at each time slot, when they transit between the output and the input of the path store, in order to supply the addresses to the speech store and to its switches. It is also at that time that a path may be replaced by another one by inhibiting the output of the circulating memory and by replacing the path word it supplies by another path word supplied by the switching center control units.

In order to identify the path words stored in such a circulating memory, a 256-position counter is associated with it. This counter steps once at each clock pulse while the words contained in the circulating memory are shifted by one step. It supplies a binary combination identifying, at once, each time slot and the path word supplied at that time by the circulating memory. This counter may be easily readjusted at each multiplex cycle; the clock delivers not only a stepping pulse at each time slot but also a readjustment pulse with the 256th stepping pulse. This readjustment resets the counter whatever its position.

The practical drawback of such circulating memories relates to the fact that there may occur a lack of synchronism between the circulating memory and its counter. Indeed, a spurious pulse may, for example, cause an untimely shift in the registers of the circulating memory. The address information supplied by the latter will then result erroneously as they will not be supplied at the appropriate times and nothing will enable the detection of the anomaly and therefore its correction. The associated counter may be concerned or not by this spurious pulse. Anyway, the counter will be readjusted at the end of the multiplex cycle and will be anew in synchronism whereas the memory will remain shifted.

In the above-described switching center, such a synchronism failure in a path store will affect all the calls transmitted via this store. This cannot be accepted.

SUMMARY OF THE INVENTION

The object of the present invention is thus a synchronism error detection and correction system for a circulating memory, designed in order not only to detect such error but also to correct it. It is obvious that the system, according to the invention, may be used in a general way, in all utilizations of circulating memories.

The present invention is mainly characterized in that the synchronism error detection and correction system of a circulating memory having an address counter includes, in particular, an auxiliary addressable memory, write control means making it possible to record in the addressable memory, at addresses deduced from the address counter position, check bits derived from certain bits selected among those stored in the circulating memory and called checked bits, read control means making it possible to read-out of the addressable memory, at addresses deduced from the address counter position, the check bits recorded therein, as well as a first comparison circuit receiving and comparing, on the one hand, the checked bits supplied by the circulating memory and, on the other hand, the corresponding check bits read-out from the addressable memory, in order to supply a synchronism signal having one value in the case when these bits are respectively identical, and another value in case of lack of synchronism.

According to another feature of the invention, the system includes moreover a second comparison circuit receiving and comparing on the one hand, the bit which follows in the circulating memory each checked bit and, on the other hand, each corresponding check bit, in order to supply a slow operation presumption signal in case of identity, as well as a third comparison circuit receiving and comparing, on the one hand, the bit which procedes in the circulating memory each controlled bit and, on the other hand, each corresponding check bit in order to supply a fast operation presumption signal in case of identity.

According to another feature of the invention, the system includes moreover logic circuits receiving the output signals of the first, second and third comparison circuit and supplying a slow operation correction control, when a slow operation presumption signal is transmitted whereas the synchronism signal indicates a lack of synchronism while the fast operation presumption signal is absent, and a fast operation correction control when a fast operation presumption signal is transmitted whereas the synchronism signal indicates a lack of synchronism while the slow operation presumption signal is absent.

According to another feature of the invention, the system includes means, constituted in particular by a bistable circuit controlled by said fast operation correction control in order to inhibit the transmission of a shift pulse towards the circulating memory.

According to another feature of the invention, the system includes means, constituted in particular by a monostable circuit controlled by the slow operation correction control and by a delay circuit receiving the output signal of the monostable and retransmitting it after a given time interval, in order to supply in response to a slow operation correction control an additional shift pulse towards the circulating memory.

According to another feature of the invention, the system includes means constituted, on the one hand, by logic gates transmitting at the input of the circulating memory either the output bits of this memory, or bits freshly supplied and, on the other hand, logic gates provided for transmitting to the addressable memory check bits derived from certain selected bits only if the latter are freshly supplied bits with the view to recording them in this addressable memory.

BRIEF DESCRIPTION OF THE DRAWINGS

Various other features will be disclosed from the following description given by way of non-limited example referring to FIGS. 1 to 8 which represent.

DESCRIPTION OF PREFERRED EMBODIMENTS

First will be described referring to FIG. 1, the block schematic of the circuits of a switching network wherein may be applied the present invention.

This network includes incoming multiplex groups such as GE1 to GE$n$. To each of them corresponds an outgoing multiplex group GS1 to GS$n$. Each multiplex group includes, for example, 256 time channels. A channel time slot corresponds to each time channel, of about 500 ns. The recurring period of a same channel time slot is 125 $\mu$s. Moreover, it is considered that the mutiplex groups are synchronous, that is that the individual channel time slots occur simultaneously in all the groups.

Figure 1:
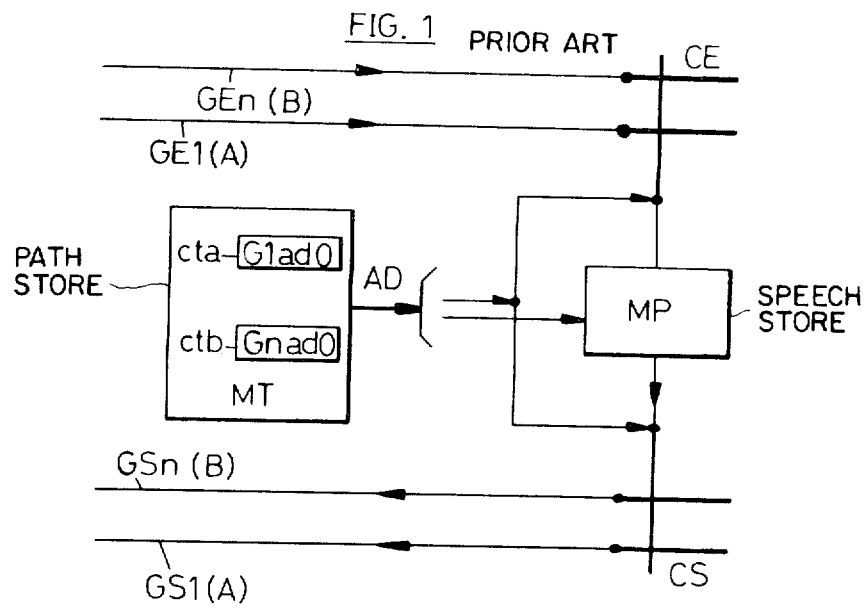
FIG. 1, the block schematic of a well-known time division switching system wherein may be applied the present invention.

For the call establishment, several switching units identical to that illustrated in FIG. 1 are provided.

This unit includes a path store MT, a speech store MP, an incoming group switch CE and an outgoing group switch CS.

The path store MT is a circulating memory having 256 cells read-out in synchronism with the multiplex group channel time slots. Each cell such as $cta$ and $ctb$ may include an address of one cell of the speech store and a multiplex group number.

The speech store MP may have up to 128 memory cells which will be each assigned to one call. These memory cells are addressed according to the information supplied by the path store MT.

The switch CE associates the input of the store MP to any incoming group, in response to the information supplied by one cell of the path store.

The switch CS associates the output of the store MP to any outgoing group.

The operation of this network will be described considering the case of a call between a subscriber (A) to which corresponds the channel time slot $ta$ on the incoming and outgoing groups GE1 and GS1 and another subscriber (B) to which corresponds the channel time slot $tb$ on the incoming and outgoing groups GE$n$ and GS$n$. In the path store MT, the memory cell $cta$ corresponds to the channel time slot $ta$ and the memory cell $ctb$ to the channel time slot $tb$.

At the channel time slot ta, the memory cell cta of the path store MT is read-out; it supplies on conductors AD the group number G1 and the address $adO$ as illustrated in $cta$ of FIG. 1. The group number G1 is sent to switches CE and CS, in parallel. In response, the latter orientate respectively onto groups GE1 and GS1. Simultaneously, the address $adO$ is transmitted to the speech store MP. In the latter, the memory cell corresponding to this address is successively the object of a read and write operation.

The information read-out at the address adO is transmitted to the multiplex group GS1, via switch CS. Then, the information present on the multiplex group GE1, transmitted via switch CE to the input of the speech store MP, is stored in lieu of that just read-out, at the address adO. Subscriber (A) has thus received a coded sample, whereas the one he supplied has just been recorded.

At the channel time slot tb, the memory cell ctb of the path store MT is read-out; it supplies the group number Gn and, anew, the address adO as illustrated in ctb of FIG. 1. The group number Gn is transmitted to switches CE and CS in parallel. In response, the latter orientate respectively onto groups GEn and GSn. Simultaneously the address adO is transmitted to the speech store MP.

The information read-out at the address adO is transmitted on the outgoing multiplex group GSn, via switch CS. Then, the information present on the incoming multiplex group GEn, transmitted via switch CE to the input of the speech store MP, is stored in lieu of that just read-out, at the address adO. Subscriber (B) has thus received the coded sample previously received from subscriber (A) and recorded at time ta, whereas the one he supplied has just been recorded at the address adO and is kept until the next time slot ta when it is transmitted to subscriber (A).

It can thus be seen that the considered call between two subscribers to which correspond different channel time slots and multiplex groups, necessitates the two path store cells cta and ctb corresponding to these channel time slots in the path store MT, any memory cell (adO) of the speech store MP and the use of switches CS and CE, at the appropriate time slots (ta and tb), in order to reach any multiplex group.

Other calls, concerning other channel time slots, are established in the same way by the switching system of FIG. 1 and, in a general way, at each channel time slot, a cell of the path store MT must supply addresses associated with a call concerning this channel time slot. Since the different cells of store MT must be cyclically read-out, it may be desirable to design said store as a circulating memory. However, this presents a risk; indeed, it can be easily seen that if, for any reason, a shift occurs in the operation of store MT, the information stored in the memory cell cta, e.g. will be supplied either before or after the time ta, which will result in an undesirable connection instead of that required. It will be the same for all calls established by the system of FIG. 1; this cannot be admitted.

The object of the present invention is thus a system enabling the detection and correction of such a shift, which results in a store MT constituted by economical circulating memories available on the market.

Now will be described, referring to FIG. 2, an embodiment of the control means of the path store MT, in the case when this memory is a circulating memory.

Figure 2:
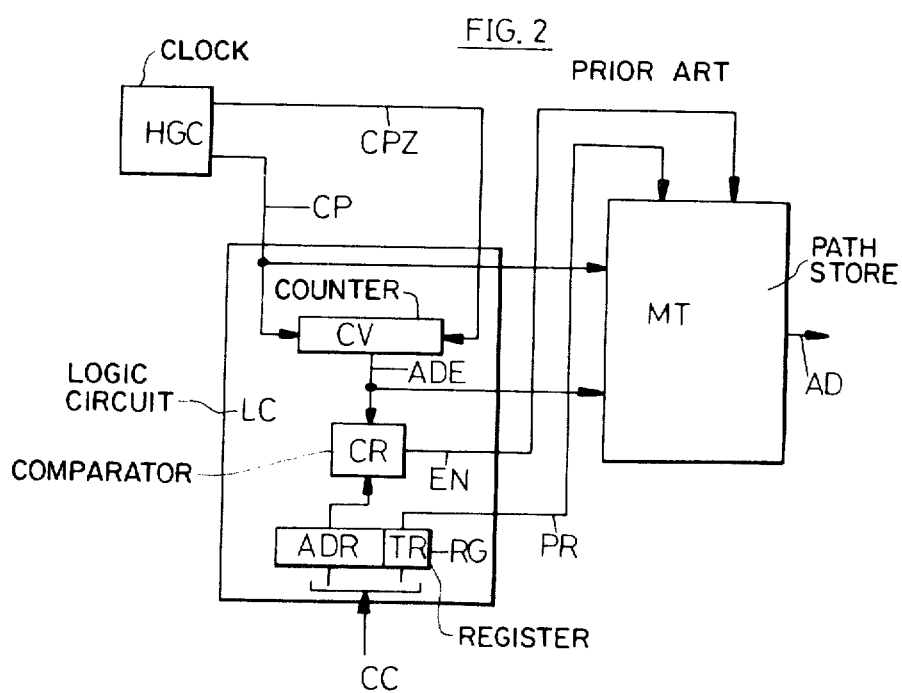
FIG. 2, the block schematic of an embodiment of the control circuits of the switching network in FIG. 1.

FIG. 2 shows besides store MT, a clock HGC and a control logic circuit LC.

The clock HGC may be the switching network central clock; it supplies on the output conductors CP and CPZ clock pulses which will also be referenced CP and CPZ.

A pulse CP is delivered per channel time slot. Every 256 pulses CP, a pulse CPZ is also supplied in order to mark the end —or the beginning — of each 256-channel multiplex cycle.

The control logic circuit LC includes an address counter CV, a comparating circuit CR and a register RG.

The address counter CV is a 256-position cyclic counter. It is controlled by the clock pulses CP. A pulse CPZ is added to the 256th pulse CP, which resets counter CV. In this way, if counter CV, due to spurious pulses, for example, has shifted by one or several steps with respect to the central clock HGC, the reset pulse CPV re-establishes the synchronism of counter CV with the clock HGC. Finally, the contents of counter CV, that is the identity of the channel time slot, is transmitted to the path store MT via conductors ADE.

The function of register RG is to receive from the non-represented central control circuits, which are beyond the scope of the invention, information concerning a path to be written into one cell of the path store MT, each time a call must be established or released. This information includes two parts, a part ADR which is the identity of the concerned channel time slot, in the path store, and a part TR which must be written in the appropriate memory cell of store MT, the description of which has been given with FIG. 1.

The comparating circuit CR receives, on the one hand, the information ADE and on the other hand, the information ADR. It compares them and, if they are equal, it supplies a recording signal on conductor EN.

The bits of the path indication TR displayed on conductor PR are then recorded in store MT and, more precisely, in the memory cell which is read-out during the channel time slot in which the identities of ADE and ADR are identical.

Store MT is a 256-stage circulating memory. The path words, such as TR, circulate step by step across these 256 stages due to pulses CP which are directly transmitted to store MT. They are available on the output AD, each one during a channel time slot the identity of which is then displayed on ADE by counter CV. It is at that time that a new path may be written into store MT, by replacing the information read-out by the information TR supplied by register RG, under control of signal EN.

As previously mentioned, it can be feared that, in such an arrangement, a spurious signal causes an untimely shift by one step of store MT. Indeed, store MT has no readjustment means as counter CV (pulse CPZ). After this untimely shift, store MT will supply erroneous information on its output AD, without the error being detected.

The invention thus provides stores MT with a detection and correction system of synchronism error. For the system requirements, the output ADE of counter CV is connected to store MT. The diagram of FIG. 3 represents in detail the detection and correction system, according to the invention.

Conventionally, the "AND" gates have been represented by a dot surrounded by a circle (symbol of logic intersection), the "OR" gates by a cross surrounded by a circle (symbol of logic union), the "EXCLUSIVE OR" gates by two concentric circles containing a cross and the logic inverters by a triangle followed by a small circle. The bistables have been represented by two juxtaposed rectangles respectively containing digits 1 and 0. The monostables by the same two juxtaposed rectangles but diagonally barred; generally the bistable and monostable inputs and outputs are respectively placed at the upper and lower part of the rectangles.

In order to simplify the figure, each information transmitted will have the same reference as the conductor which forwards it.

Figure 3:
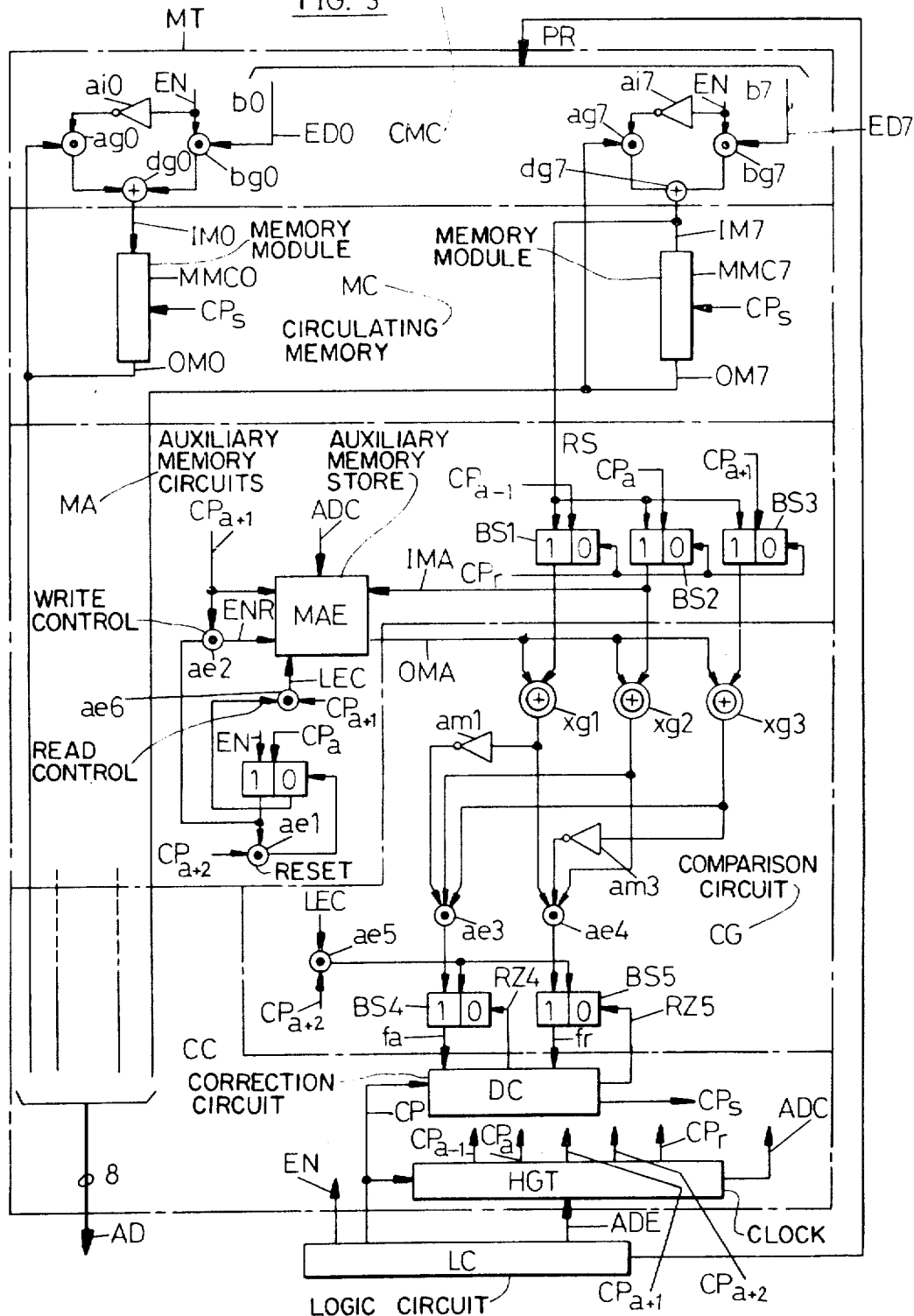
FIG. 3, an embodiment of the store MT equipped with the detection and correction system according to the present invention.

The path store MT of FIG. 3 includes in particular a circulating memory MC and the control circuits CMC of this memory, an auxiliary memory circuit MA, a recording and transmission circuit RS, a comparison circuit CG and control circuits CC.

The circulating memory MC includes 8 inputs IMO to IM7, 8 outputs OMO to OM7 and 8 circulating memory modules MMCO to MMC7 which are 256-stage shift registers. Each of them shifts by one step the 256 bits it contains at each pulse $CP_s$. Generally, the shift pulse $CP_s$ corresponds to the pulse CP supplied by the clock HGC (FIG. 2). Therefore, a bit is supplied at the output of the module, while the bit present on its input enters its first stage by shift. In order to simplify the figure, only the first and last inputs, the first and last outputs and the first and last memory modules have been represented. Although 8 memory modules have been represented, it is to be noted that this number may vary according to the requirements. It could be duplicated, for example, in the previously mentioned application.

The first memory module MMCO receives the first bit $b0$ of a coded sample to be recorded which is supplied on conductors PR via the control circuits CMC. These circuits include in particular, for this modules MMCO, a conductor EDO, an AND gate $bg0$ and an OR gate $dg0$. The AND gate $bg0$ is enabled by a recording signal supplied on conductor EN. In the absence of this signal, the module MMCO receives, on its input IMO, the data bit present on its output OMO, via an AND gate $ag0$, which is rendered conducting by the output signal of an inverting circuit $ai0$, that is the reverse of signal EN, and via the OR gate $dg0$.

Similar means are associated with the module MMC7 and with the non-represented modules. Thus, the bit $b7$ of the coded sample PR is supplied at the input of the module MMC7 via a conductor ED7, an AND gate $bg7$ and an OR gate $dg7$. The AND gate $bg7$ is controlled by the recording signal EN. In the absence of this signal, the module MMC7 receives, on its input IM7, the data bit present on its output OM7, via an AND gate $ag7$ enabled by the output signal of an inverting circuit $ai7$, that is the reverse of signal EN, and via the OR gate $dg7$.

Thus, practically, if the signal EN is present, the information supplied by the logic circuits LC enter memory MC, for the writing of a new path as above-described. If the signal EN is absent, which will be most frequently the case, the input of the memory is coupled to its output and the information stored in the memory are kept while cyclically appearing on the outputs OMO to OM7 of the modules. These outputs are connected to the link AD with the view to using the information in the previously described way.

The control circuits CC include in particular the clock circuit HGT and a correction circuit DC.

The clock circuit HGT receives from the logic circuits LC the pulses CP as well as the identity ADE of each channel time slot. It supplies in response pulses $CP_{a-1}$, $CP_a$, $CP_{a+1}$, $CP_{a+2}$, $CP_r$ as well as an address ADC.

Figure 4:
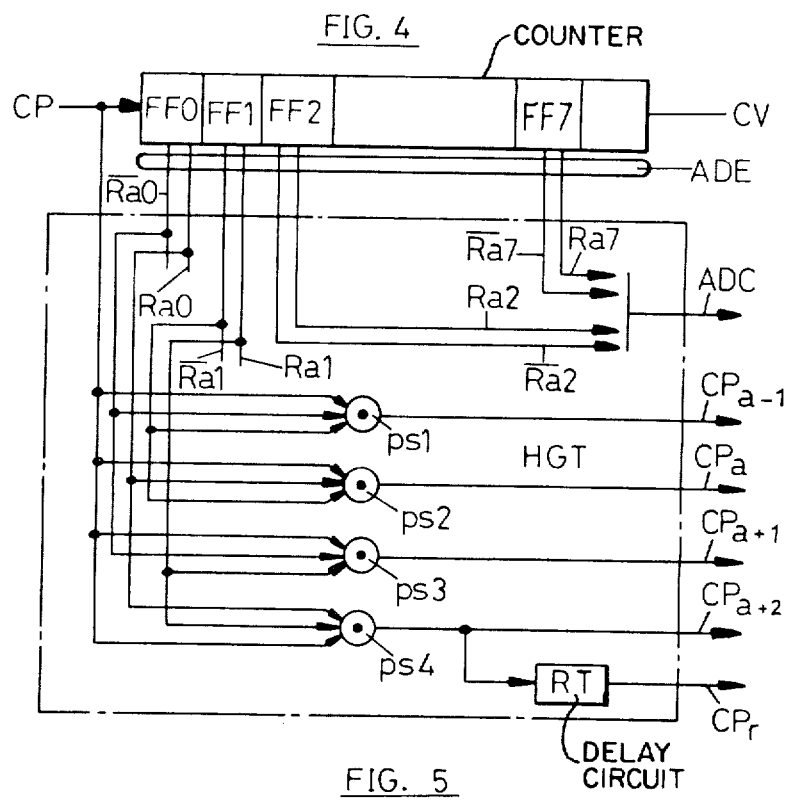
FIG. 4, an embodiment of circuit HGT of FIG. 3.
Figure 5:
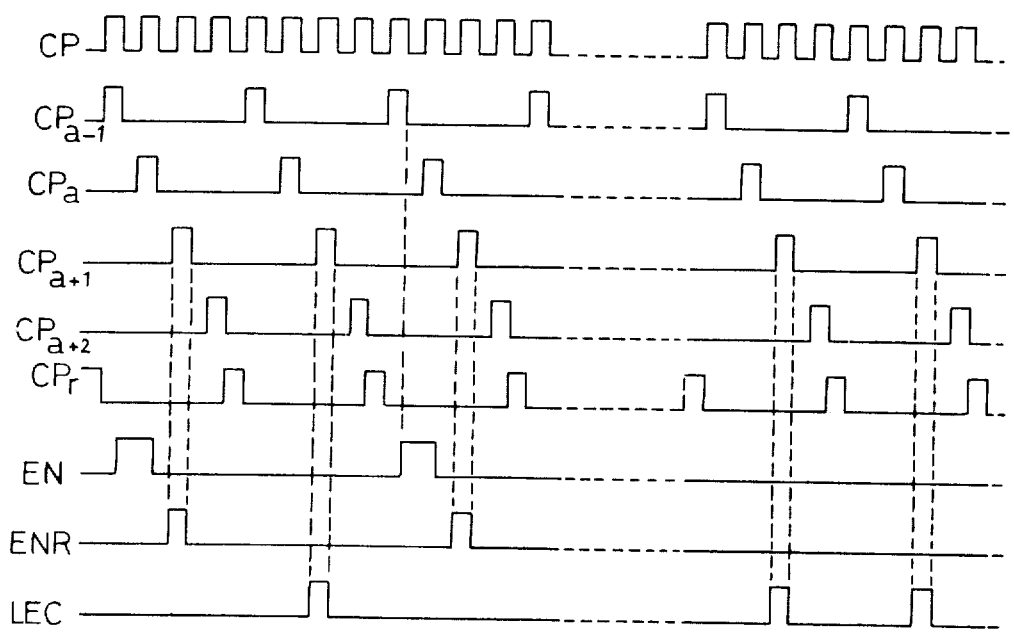
FIG. 5, waveshapes illustrating the signals supplied by the circuits of FIGS. 3 and 4.

An embodiment of the clock circuit HGT is shown in FIG. 4. This circuit includes four AND gates $ps1$ to $ps4$ receiving in particular the clock pulses CP. It has been previously seen that the central clock HGT also supplies pulses CP to counter CV. The latter is here illustrated by 8 bistables FF0 to FF7. The outputs Ra2 to Ra7 and $\overline{Ra2}$ to $\overline{Ra7}$ of the six bistables FF2 to FF7 supply information to the clock HGT which redistributes it in the form of the information ADC. The outputs Ra0, $\overline{Ra0}$, Ra1 and $\overline{Ra1}$ of bistables FF0 and FF1 supply control signals to gate ps1 to ps4. Accordingly, the gate ps1 is controlled by the signals supplied on the outputs $\overline{Ra0}$ and $\overline{Ra1}$. It supplies the signal $CP_{a-1}$. The gate ps2 is controlled by the signals supplied on the outputs Ra0 and $\overline{Ra1}$ and transmits signal $CP_a$. The gate $ps3$, controlled by the signals supplied on the outputs $\overline{Ra0}$ and Ra1, transmits the signal $CP_{a+1}$, and the gate $ps4$, controlled by the signals supplied on the outputs Ra0 and Ra1, transmits the signal $CP_{1+2}$. These different signals are represented in FIG. 5. It can be seen that the pulses $CP_{a-1}$ to $CP_{a+2}$ are cyclically generated every four pulses CP.

The clock circuit HGT also includes a delay circuit RT. This circuit receives the signal $CP_{a+2}$ and, in response, delivers, after a short delay, a signal $CP_r$. The latter, also represented in the waveshapes of FIG. 5, is generated between the signal $CP_{a+2}$ the waveshapes of FIG. 5, is generated between the signal $CP_{a+2}$ and the first next signal $CP_{a-1}$.

The address ADC, deduced from the address ADE by removing the two lowest order bits, increases by one unit each time the address ADE increases by four units.

The recording and transmission circuit RS (FIG. 3) includes in particular three bistables BS1, BS2 and BS3. The triggering inputs of these bistables respectively receive the pulses $CP_{a-1}$, $CP_a$ and $CP_{a+1}$. The input 1 of each of them is connected to the input IM7 of the circulating memory module MMC7. Thus, for four bits inserted into module MMC7, three of them are displayed respectively on bistables BS1, BS2 and BS3. There will be given to these bits the general references $b_{a-1}$, $b_a$ and $b_{a+1}$. The bistables BS1 to BS3 are reset by the pulses $CP_r$.

The auxiliary memory circuit MA includes in particular an addressable memory MAE and its control circuits. In the presence of a write signal ENR, thus in the absence of a read signal LEC, the bit supplied on the input conductor IMA of the memory MAE is recorded, at the address ADC, in a memory location. When the read signal LEC is present, the bit recorded at the address ADC is supplied on the output conductor OMA of the memory MAE.

The control circuits of this adddressable memory mainly include three AND gates $ae1$, $ae2$ and $ae6$ and one bistable BS6. The latter is set when the recording signal EN supplied on its input 1 appears simultaneously with the pulse $CP_a$ supplied on its triggering input. The gate $ae2$, one input of which is connected to the direct output of the bistable BS6, becomes conducting. It sends at the appearance of the next pulse. $CP_{a+1}$, a recording signal ENR (FIG. 5) to the memory MAE. When the next pulse $CP_{a+2}$ appears, the gate $ae1$ is enabled and retransmits an appropriate signal on a reset input of the bistable BS6; this bistable in then reset. The gate $ae6$, controlled by the pulse $CP_{a+1}$ and the complementary output signal of the bistable BS6, supplies, at the appearance of the pulse $CP_{a+1}$ and further to the absence of the signal EN, a read signal LEC also represented in FIG. 5.

Therefore, at each pulse $CP_{a+1}$, a read or write operation is carried out in the memory MAE. FIG. 5 shows an example of the signals present at different points of the circuits in FIGS. 3 and 4 in the case when a write operation is carried out followed by a read operation and then by a second write operation followed by two read operations. The address ADC increases by one unit each time. If at the immediately preceding time $CP_a$, the signal EN was present, the operation to be performed at the time $CP_{a+1}$, in memory MAE is a writing process. Indeed, the bit supplied on conductor ED7 of the link PR, which can be called $b_a$, is sent to the input IM7 of the module MMC7 and, at time $CP_a$, it enters said module. Simultaneously, it is recorded by the bistable BS2. Then, at time $CP_{a+1}$, said bit $b_a$ supplied by the bistable BS2. Then, at time $CP_{a+1}$, said bit $b_a$ supplied by the bistable BS2, is recorded in memory MAE, in a location defined by the address ADC as previously described. Consequently, memory MAE, fed in this way, will keep an "extract" continuously up-dated of what contained the module MMC7; more precisely, it will keep one bit among four, designated by $CP_a$ among those contained in the module MMC7.

If in a time $CP_a$, the signal EN is absent, the operation to be performed at time $CP_{a+1}$ is a reading process. As an example, it may be contemplated that this reading takes place exactly one cycle after the recording of the previous bit $b_a$. At time $CP_{a+1}$, the memory MAE restores the bit $b_a$ on the conductor OMA.

This operation aims at checking the operation of the whole circulating memory and, more particularly, of the module MMC7. Indeed, it has been seen that the bistables BS1, BS2 and BS3 receive the bits stored in the module MMC7 at times $CP_{a-1}$, $CP_a$ and $CP_{a+}$. If there is no path recording, these bits come from the module output. Consequently, at the time when in memory MAE, the bit $b_a$ is read-out, this same bit has just been supplied by the module MMC7. It is recalled that this bit has entered the module at a time $CP_a$. It must normally be present on the module output, one cycle later, also at a time $CP_a$. It must be written on bistable BS2. But if there exists a shift error in the circulating memory, this bit $b_a$ may come out from module MMC7, either one time before, at $CP_{a-1}$, or one time later at $CP_{a+}$. Then it will be displayed on bistable $BS_1$ or $BS_3$.

The comparison circuit CG includes in particular three "EXCLUSIVE OR" gates $xg1$, $xg2$ and $xg3$, two logic inverting circuits $am1$, $am3$, three AND gates $ae3$, $ae4$, and $ae5$ and two bistables BS4 and BS5. The first input of each gate $xg1$ to $xg3$ is connected to the output conductor OMA of memory MAE. The second inputs of these gates are respectively connected to the outputs 1 of bistables BS1, BS2 and BS3 of circuit RS. The outputs of these gates are connected either directly, or via two inverting circuits $am1$ and $am3$ to the inputs of gates $ae3$ and $ae4$. Finally, the outputs of both gates are respectively connected to the inputs 1 of bistables BS4 and BS5. The triggering inputs of these bistables are connected to the output of the AND gate $ae5$ controlled by signals $CP_{a+2}$ and LEC.

Thus, normally, the bit $b_a$, enters the module MMC7 at time $CP_a$ and is recorded at the same time $CP_a$, one cycle later, by bistable BS2. It is available on the bistable output until the next time $CP_{a+2}$. In memory MAE, this same bit is read-out at time $CP_{a+1}$. It is available on the output conductor OMA of memory MAE during the time $CP_{a+2}$. During the latter, the three bits displayed by bistables $BS_1$ to $BS_3$ are compared to the bit displayed on conductor OMA and which has just been read-out from memory MAE.

It will be first assumed that the synchronism is correct, that is that there exists identity between the bit displayed on bistable BS2 and the bit available on the output conductor OMA of memory MAE. the EXCLUSIVE OR gate $xg2$ then supplies no signal. Gates $ae3$ and $ae4$ are non-conducting and deliver no signal to bistables BS4 and BS5. No correction control is sent to the correction circuit DC. The latter retransmits to the modules of the circulating memory MC pulses CP in the form of shift pulses $CP_S$.

It will now be assumed that there is no synchronism, that is, no identity between the bit displayed on bistable BS2 and the bit available on conductor OMA, but that there exists identity between the bit displayed on bistable BS1 at time $CP_{a+1}$ and the bit available on conductor OMA. There is thus lack of synchronism and it can be assumed that there is a shift forward of the circulating memory. The EXCLUSIVE OR gate $xg2$ supplies a signal 1 and therefore enables gates $ae3$ and $ae4$. The EXCLUSIVE OR gate $xg1$ supplies no signal and thus disables the gate $ae4$ and via the inverting signal $am1$ supplies a signal 1 to gate $ae3$. This gate becomes conducting when its third input is at 1, that is when the EXCLUSIVE OR gate $xg3$ supplies a signal. This is obtained when there is no identity between the bit displayed on bistable BS3 at time $CP_{a+1}$ and the bit present on conductor OMA. It will then be assured that the circulating memory is shifted by one step forward. Gate $ae3$ delivers a signal to bistable BS4 which, in response, supplies a fast operation correction control $fa$ to the correction circuit DC. The latter, upon receiving it, will not supply one of the next received pulses CP in the form of a shift pulse $CP_S$. The circulating memory is thus prevented from stepping once. It is provided to equip the installations with a signalling means controlled by the fast operation correction control $fa$.

It will now be assumed that there is no synchronism and that the bit available on conductor OMA is identical to that displayed on the bistable BS3 at time $CP_{a+1}$. The gate $xg2$ supplies a signal which enables gates $ae3$ and $ae4$. The gate $xg3$ supplies a 0 signal which renders gate $ae3$ non conducting. When the bit displayed on the bistable BS1 is different from the bit available on the output conductor OMA of memory MAE, it is assured that the circulating memory MC is shifted by one step backward. In this case, the gate $xg1$ delivers a 1 signal which is retransmitted by gate $ae4$ to the bistable BS5. In response, this bistable supplies a slow operation correction control $fr$ to the correction circuit DC. The latter, upon receiving it, will supply when one of the next pulses CP is received, two shift pulses $CP_s$ to the memory MC. The shift backward of this memory is thus corrected. It is provided to equip the installations with a signalling means controlled by the slow operation correction control $fr$.

Thus, in the system according to the invention, the bits present on the input IM7 of the memory module MMC7 at times $CP_{a-1}$, $CP_a$ and $CP_{a+1}$ are respectively displayed on bistables BS1, BS2 and BS3. If at time $CP_a$, the signal EN is absent, a read signal LEC is supplied to memory MAE. The bit recorded in this memory at the addres defined by ADC, that is the bit which has entered the module MMC7 at the corresponding time $CP_a$, during the preceding cycle, is supplied on the output OMA of memory MAE. It must be the same as the bit displayed on the bistable BS2. If it is the case, no fault correction signal is supplied to the circuit DC. The latter, in this case, supplies simultaneously as it receives a pulse CP, a shift pulse $CP_S$ to the modules of the circulating memory MC.

If this condition is not fulfilled and if the bit supplied by the memory MAE is identical to that displayed at time $CP_{a-1}$ on the bistable BS1 and different from the bit displayed on bistable BS3 at time $CP_{a+1}$, it is certain that the error concerns the one forward step of the circulating memory. A fast operation correction control $fa$ is supplied to the correction circuit DC. In response, the latter will not supply to the modules of the circulating memory MC a shift pulse $CP_S$ in response to the next received pulse CP. The one forward step is thus corrected.

If the bit supplied by memory MAE is identical to that displayed at time $CP_{a-1}$ on bistable BS3 and different from the bit displayed on bistable BS1 and from the bit displayed on bistable BS2, it is certain that the error concerns one step backward of the circulating memory. A slow operation correction control $fr$ is supplied to the correction circuit DC. In response, the latter as it receives a pulse CP supplies two shift pulses $CP_S$ to the modules of the circulating memory MC. The one backward step is then corrected.

Now will be described, referring to FIGS. 6 to 8, an embodiment of the correction circuit DC.

Figure 6:
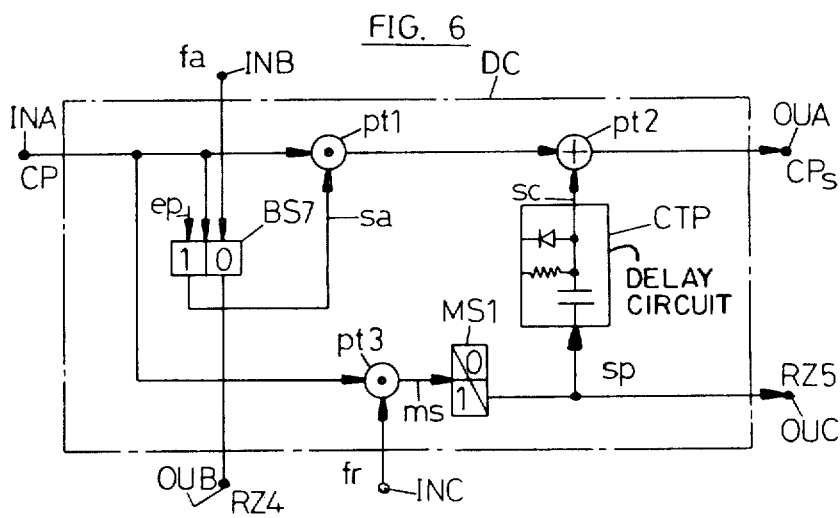
FIG. 6, an embodiment of the correction circuit DC of FIG. 3.
Figure 7:
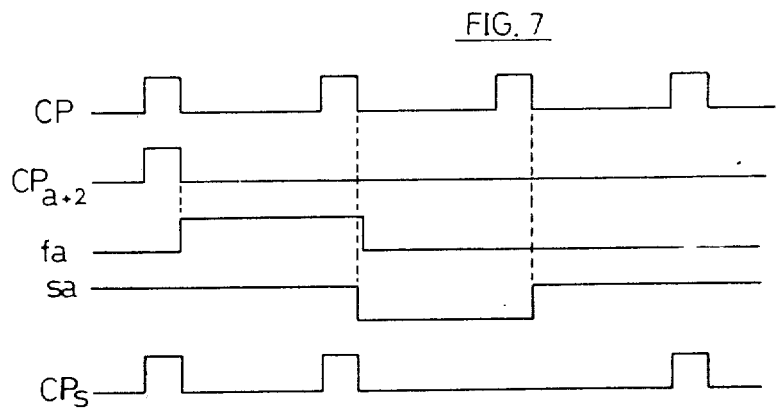
FIGS. 7 and 8, waveshapes illustrating an example of signals exchanged between the different elements of the correction circuit DC of FIG. 6.

The correction circuit of FIG. 6 includes in particular 3 inputs INA, INB and INC receiving respectively the clock pulses CP, the fast and slow operation correction controls $fa$ and $fr$. It delivers on its output OUA the shift pulses $CP_S$ and on the outputs OUB and OUC the pulses RZ4 and RZ5 which reset bistables BS4 and BS5 of the comparison circuit CG. It also includes one bistable BS7, one monostable MS1, two AND gates $pt1$ and $pt3$, one OR gate $pt2$ and a delay circuit CTP.

The bistable BS7 receives a permanent signal $ep$, on its input 1, the pulses CP on its triggering input and the fast operation correction control $fa$ on its input 0.

When it receives simultaneously a signal on its triggering input and a signal on its input 1, this bistable triggers to state 1. Similarly, when it receives simultaneously a signal on its triggering input and a signal on its input O, it triggers to state O.

If it simultaneously receives a signal on its three inputs, it triggers. It will be assumed that initially bistable BS7 is in state 1.

When there is no correction signal $fa$, the first pulse CP maintains the bistable in position 1. The AND gate $pt1$ becomes conducting due to the signal present on an output conductor $sa$ of bistable BS7. The pulses CP supplied at the input INA are then retransmitted in the form of shift pulses $CP_S$ to the output OUA, via the OR gate $pt2$.

It will be assumed that the comparison circuit CG of FIG. 3 delivers a fast operation correction control $fa$. As it can be seen in FIG. 3, this signal illustrated by the waveshapes of FIG. 7, is generated from the trailing edge of a pulse $CP_{a+2}$. The next pulse CP causes the triggering of bistable BS7 to state O. This bistable, on the one hand, disables the gate $pt1$ and, on the other hand, supplies a signal RZ4 on the output OUB. This signal resets bistable BS4 of circuit CG. The fast operation correction control $fa$ is no longer supplied.

The next pulse CP is not transmitted to the output OUA as gate $pt1$ is blocked. The trailing edge of this pulse causes bistable BS7 to trigger to state 1. There results, on the one hand, the enabling of gate $pt1$ and, on the other hand, the removal of signal RZ4 which resets bistable BS4. The operation is then continued as above-described.

Thus, the correction circuit DC has not sent to the circulating memory MC a clock pulse CP. As this pulse is normally supplied to the address counter CV, the memory steps back once with respect to the counter in order to be anew in synchronism.

Figure 8:
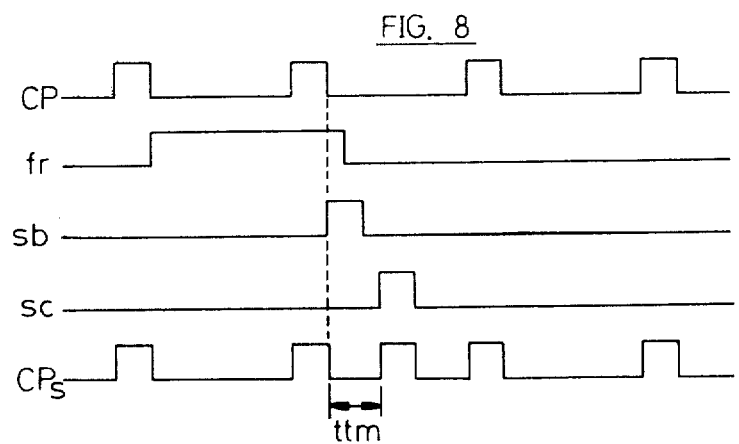

It will be now assumed that the comparison circuit CG delivers a slow operation correction $fr$, illustrated by the waveshapes of FIG. 8. The next pulse CP is normally sent in the form of a shift pulse $CP_S$ at the output OUA of circuit DC. It is also transmitted on the output ms of the gate $pt3$ rendered conducting by signal $fr$. It causes the triggering of the monostable MS1. The output $sb$ of the latter triggers to state 1 and then returns to state O. The positive pulse $sb$ thus produced is supplied to the delay circuit CTP which, in response, supplies, after a time ttm a pulse on its output $sc$. This pulse is retransmitted via gate $pt2$ to the output OUA of the circuit DC.

Moreover, the output pulse of the monostable MS1 is supplied on the output OUC, in the form of a pulse RZ5 which resets bistable BS5. The slow operation correction control $fr$ is no longer supplied and the gate $pt3$ becomes non-conducting. The operation is then continued as above-described.

Thus, the correction circuit DC has transmitted to the circulating memory MC two shift pulses $CP_S$ at the reception of one pulse CP. The memory goes one step ahead of counter CV and is in synchronism once again.

The correction circuit DC of FIG. 6 thus meets the definition of circuit DC of FIG. 3 and enables the readjustment of the circulating memory MC upon the appearance of a synchronism error signal.

It is obvious that the preceding description has only been given as an unrestrictive example and that numerous alternatives may be considered without departing from the scope of the invention. In particular, all numerical details have been given only to facilitate the understanding of the invention and may vary with each application.

We claim:

1. A synchronization correction system for a recirculating memory controlled by an address counter, comprising means for feeding a series of address control bits derived from said counter to said memory, an auxiliary memory, enabling means connected to receive said bits and responsive to said bits for feeding one of said bits for storage in said auxiliary memory at a time having predetermined timed relationship to the feeding of bits to said recirculating memory, means for reading out said one bit from said auxiliary memory at a predetermined time interval thereafter, comparison means for comparing the bit read out of said auxiliary memory with bits fed from said enabling means, correction control means responsive to the comparison of said bits for emitting a first signal when the compared bits are identical and emitting second signals when the compared bits are not identical, and means responsive to said second signals for correcting the timing of feeding of bits to said recirculating memory.

2. A system as claimed in claim 1, wherein said enabling means comprises a plurality of bistable circuits each enabled responsive to successive bits fed to said recirculating memory, and one of said bistable circuits being responsive to said one bit, and others of said bistable circuits responsive to other successive bits of said series.

3. A system as claimed in claim 2 in which said comparison means comprises a plurality of gates, each gate having as one input thereto an output from one of said enabling means and each said gate having as another input thereto a path for the read out of bits from said auxiliary memory.

* * * * *